United States Patent [19]

Cedrone

[11] 4,429,275

[45] Jan. 31, 1984

[54] HANDLING AND TEST APPARATUS FOR RADIAL LEAD ELECTRONIC DEVICES

[76] Inventor: Nicholas J. Cedrone, 10 Hawthorne Rd., Wellesley Hills, Mass. 02181

[21] Appl. No.: 173,445

[22] Filed: Jul. 30, 1980

[51] Int. Cl.³ .................. G01R 31/00; B07C 5/344
[52] U.S. Cl. .................. 324/158 F; 209/573; 324/73 AT
[58] Field of Search ............ 324/158 F, 73 AT; 209/548, 573

[56] References Cited

U.S. PATENT DOCUMENTS 3,537,580 11/1970 Beroset et al. .................. 209/573
4,320,339 3/1982 Vancelette .................. 324/158 F

OTHER PUBLICATIONS

Transistor Sorter, Type 830; Bulletin from Daymarc Corp., Waltham, Mass.; 2 pages.
Transistor Sorter, Type 1635; Bulletin from Daymarc Corp., Waltham, Mass.; 2 pages.

*Primary Examiner*—Ernest F. Karlsen
*Attorney, Agent, or Firm*—Kenway & Jenney

[57] ABSTRACT

An automatic handling and testing machine for radial lead electronic devices such as transistors has a probe assembly that includes drive components powered by a rotating drive shaft that develop a cycled, closed loop movement of a platform and one or more contactor assemblies mounted on the platform. A base member supports a set of rotary cams detachably connected to the drive shaft, a four arm linkage that follows the cams, and the platform pivotally supported on the linkage. The contactor assemblies are adjustable with respect to the leads in all three directions and are structured for rapid and convenient attachment to the platform. The base member, cams, linkages, and platform form an integral, self-contained unit that is replaceably secured to the machine housing, preferably by a single screw. A linear shuttle carries the devices in horizontal steps through a series of test stations each associated with one of the contactor assemblies. The linear shuttle operates cyclically in coordination with the probe assembly. The shuttle also includes a set of clamps that close and open during the cycle of operation to grip and release the bodies of the devices. In the preferred form, the shuttle is mounted for reciprocal sliding movement in a horizontal direction. The shuttle includes a mechanical assembly that operates the clamps in coordination with the reciprocating motion.

34 Claims, 17 Drawing Figures

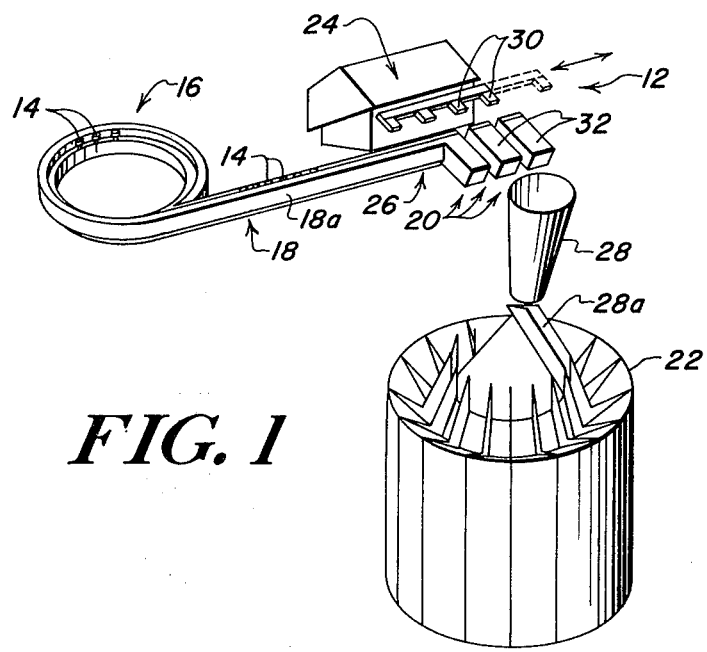
FIG. 1
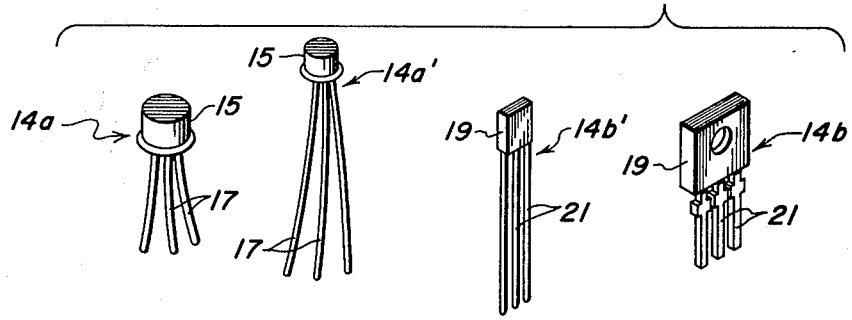
FIG. 2
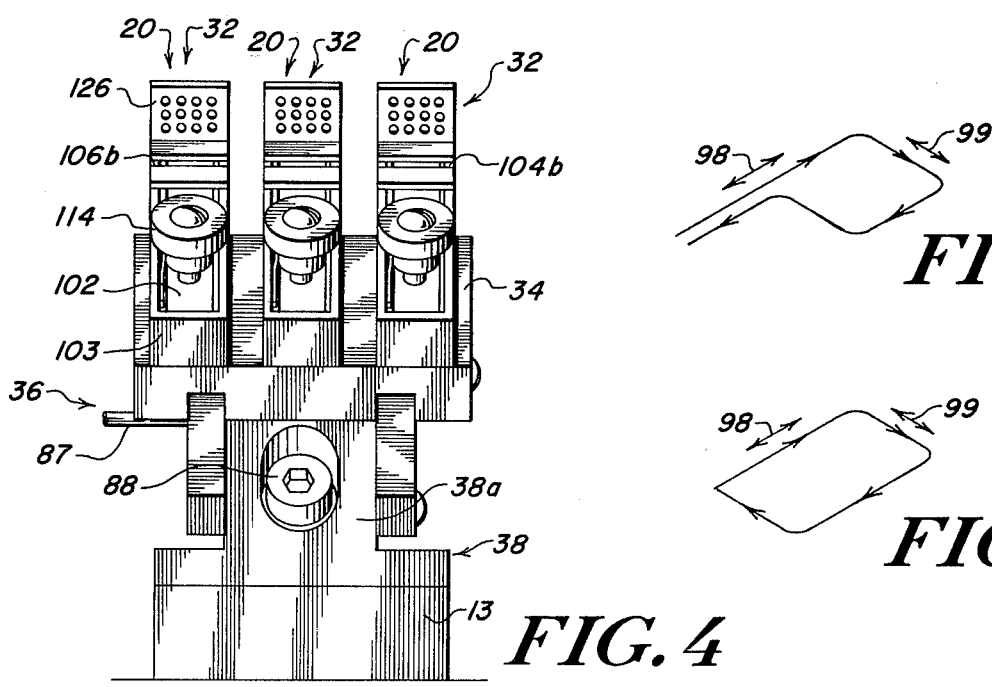
FIG. 4
FIG. 5
FIG. 6

HANDLING AND TEST APPARATUS FOR RADIAL LEAD ELECTRONIC DEVICES

BACKGROUND OF THE INVENTION

This invention relates generally to apparatus for handling, sorting and testing electronic devices. More specifically, it relates to an apparatus for testing a wide range of radial lead devices and featuring a probe assembly with a self contained drive train, adjustable contactor assemblies, and a linear shuttle that carries the devices in a cycled pick and place motion through a series of test stations.

In the manufacture of electronic devices it is necessary to test the devices and sort them according to whether they are defective or according to the value of some parameter. The sorted devices are collected in bins. Production economics require that these testing, sorting and collecting operations be very rapid, reliable and without significant interruption.

The design of the handling and sorting apparatus must take into account the type of device being processed. Devices generally fall into one of three categories, integrated circuits having two parallel rows of leads, axial lead devices such as resistors and diodes, and radial lead devices such as signal and power transistors. Radial lead devices have a body and a set of leads, typically three or four, which extend from the body in generally the same direction.

Radial lead devices present several handling problems. First, their overall geometry is less conductive to automated handling than other more compact or more symmetrical devices. Second, their leads, particularly those of certain commonly used signal transistors, are often narrow wires that are easily bent. The apparatus must therefore be able to reject devices with badly bent leads and test properly configured devices without bending the leads or causing them to contact one another during testing. It is also preferable that the apparatus be capable of straightening leads of devices that are slightly bent. Another difficulty is that the reliability of the test is directly related to the ability of the test system to remove an oxide surface coating that builds up on the device leads. A known solution is to "wipe" or scrape the contacts over the leads before testing. This is clearly a more difficult mechanical problem when the leads are fine wires.

Apparatus capable of handling these devices are known in the prior art. The present assignee, for example, manufactures transistor sorters and testers under the trade designations Type 830 and Type 1635. Typical continuous operating speeds of these units are 4,000 and 5,600 transistors per hour, respectively. While these units function well, they have a disadvantage in that they accept a limited range of devices. The Type 830 sorter processes only small signal transistors having generally cylindrical, "can" bodies. The Type 1635 sorter accepts "can" body signal transistors as well as molded power transistors and signal transistors with non-cylindrical bodies. However, to process these different types of devices, the sorter must be broken down and reassembled with different handling components and test probes. The conversion components are costly and the conversion operation requires as much as an hour to complete.

To wipe the leads, the Type 830 sorter utilizes a "side entry" feed where the leads are moved into a sliding engagement with the contacts. This contactor arrangement also performs a certain degree of lead combing. The Type 1635, while in general more versatile than the Type 830, does not provide lead straightening. Also, the wiping action is frequently developed by a flexure of the test contacts as they are lowered onto the leads. This method of developing a wiping action can be effective, but because the contacts move in substantially one direction they develop only a comparatively small wiping movement of the contact tip on the lead. Also, with fine wire leads such a system must also include an arrangement for supporting the leads against the lateral force of the contacts.

In use on a production line for electronic equipment, it is very desirable to be able to switch from processing one type of radial lead device to the processing of another type depending on production requirements. More generally, it is very desirable to have one test handler/sorter which can quickly and reliably test any of a wide range of devices. The range should include comparatively large heavy molded power transistor with strip leads either aligned in a row or in a triangular array, small signal transistors with cylindrical bodies and long or short wire leads in a triangular array, and any of the other common types of devices such as those with semi-cylindrical bodies. No known sorting and testing apparatus can readily convert to process all of these devices.

It is therefore a principal object of the invention to provide an apparatus for handling and testing radial lead devices that quickly and easily converts to accept devices having a wide range of configurations, masses, and lead types.

Another object of the invention is to provide an apparatus with the foregoing advantages that drives its contacts in a motion that includes an effective wiping action that ensures a reliable electrical connection, and in the case of fine wire leads, can comb them.

Another principal object of the invention is to provide a handling system that reliably and quickly carries the devices through a series of test stations and positions then accurately at each test station for testing and other processing.

A further object is to provide an apparatus with the foregoing advantages where the contacts can also be adjusted longitudinally, laterally and vertically with respect to the leads of a device positioned at a teat site.

Another object is to provide an apparatus which allows the replacement of component such as the handling system and probe assembly with no loss of synchronization between these assemblies.

Yet another object is to provide an apparatus where the entire contactor assembly is easily and quickly replaced.

Still another object is to provide an apparatus with the foregoing advantages that has a high operating speed, is dependable, and does not require close supervision.

SUMMARY OF THE INVENTION

An apparatus for automatically handling, testing and sorting radial lead electronic devices has an integral, replaceable probe assembly detachably connected to a rotating drive shaft. The probe assembly includes a platform that mounts one or more test contactor assemblies and a mechanical drive train that converts the motion of the drive shaft into a closed path, cycled motion of the platform. The cycled motion includes a longitudinal component directed along the leads and a vertical component perpendicular to the leads. During one portion of the cycle, electrical contacts of the contactor assembly make electrical connection with the leads in a wiping motion. The platform and drive train are supported on a base member that is secured by a screw to a frame of the test apparatus. The detachable connection to the drive shaft is structured so that upon removal of the screw, the entire probe assembly, including the drive train, is removable and replaceable as an integral unit.

The drive train preferably includes a four arm linkage with the platform constituting one of the arms. Two support arms have a common pivot axis removed from the platform and include cam followers that each ride a separate rotary cam. All four of the linkage arms are pivotally connected to one another. The cams preferably rotate in unison on a common hub. In the preferred form, the detachable drive connection includes a crank arm secured to the drive shaft and a mating open slot formed in the hub. A complete cycle of operation of the probe assembly occurs with each rotation of the drive shaft. The crank arm and recess complete a cycle of operation in the same angular position, preferably one which facilitates the removal of the probe assembly. The probe assembly also preferably includes springs to bias the cam followers against the cams.

One of the cams and the associated linkages move the platform and the contactor assembly in the longitudinal direction; the other cam and associated linkages move the platform in the vertical direction. When used to process signal devices with wire leads, the longitudinal movement is sufficiently long to "comb" and straighten bent leads. When used to process power devices with strip leads, the longitudinal "out" movement away from the body of the device is coordinated with the extreme "down" portion of the vertical movement to wipe the leads.

The contactor assemblies each include a generally box-shaped frame and a set of contacts secured to a forward portion of the frame. The frame has a U-shaped side and rear walls and a bottom wall secured only to the rear wall. The bottom wall is secured, preferably by two set screws engaged in elongated closed slots, to the platform and its position is longitudinally adjustable on the platform. A manually rotatable cam drives the side walls in either lateral direction to provide an adjustment in the lateral position of the contacts on the leads. A spring loaded screw that bridges the forward frame portion and the bottom wall provides a vertical positional adjustment. In certain test applications, this movement also adjusts the contact force on the leads.

A linear shuttle carries the devices in an incremental, step-wise fashion from a pick-off point to one or more test stations each associated with a test contactor assembly, lead comb or dot marker mounted on the platform. The shuttle provides a "pick and place" movement that is coordinated with the cycle of operation of the probe assembly. The shuttle includes an assembly that drives it in a linear, reciprocating motion. This drive assembly, in the preferred form, is a rotary cam that acts on a pivoted shaft which in turn engages a main shuttle assembly that carries a set of device gripping clamps on an opposed pair of mounting plates. The shuttle also includes an assembly for opening and closing the clamps in coordination with the reciprocating linear movement. This control assembly, in the preferred form, includes a drive shaft that rotates two rotary cams that each displace a runner plate. A mechanical coupling translates the displacement of the runner plate into an opening or closing movement of the opposed pair of mounting plates. In the preferred form, this coupling is a set of arms operatively engaged between the runner plates and the mounting plates through rollers that ride over the runner plates. Each clamp closes to grip the body of a radial lead device and opens to release it. The clamp control assembly also preferably causes the clamps to raise a gripped device slightly before it is carried horizontally and lower it to its initial vertical position at the end of the horizontal movement.

These and other features and objects of the invention will become apparent to those skilled in the art from the following detailed description of the preferred embodiments which should be read in light of the accompanying drawings.

BRIEF DESCRIPTION OF THE DRAWINGS

FIG. 1 is a highly simplified schematic view in perspective of a handling and testing apparatus according to the present invention including a feed system, linear shuttle and test stations;

FIG. 2 is a view in perspective of several radial lead electronic devices that can be process by the apparatus shown in FIG. 1;

FIG. 4 is a simplified view in front elevation of the probe assembly shown in FIG. 3 but including three contactor assemblies mounted on the platform;

FIG. 5 is a view in side elevation of one closed loop path of motion of the platform and the contactor assemblies mounted on the platform;

FIG. 6 is a view corresponding to FIG. 5 of another path of motion;

DETAILED DESCRIPTION OF THE PREFERRED EMBODIMENTS

Figure 3:
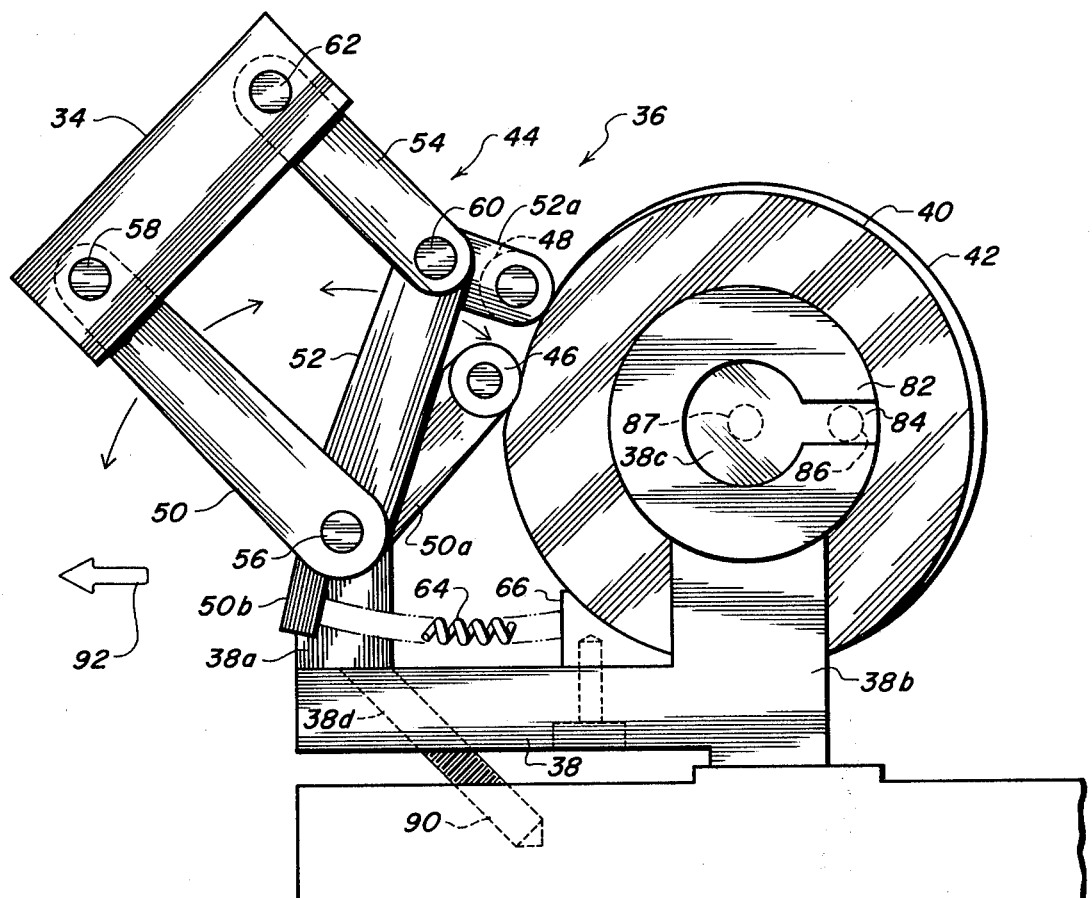
FIG. 3 is a view in side elevation of the probe assembly shown in FIG. 1.

FIG. 1 shows an apparatus 12 according to the present invention which handles, tests and sorts a wide variety of radial lead devices 14 such as those shown in FIG. 2. These devices can include small signal transistors 14a, 14a' typically having a body 15 that is a generally cylindrical "can" and leads 17 that are fine wires. The apparatus also handles molded power transistors 14b, 14b' typically having much larger and heavier rectangular bodies 19 and an aligned set of strip leads 21. The apparatus 12 also processes a wide variety of other radial lead devices such as signal transistors with semi-cylindrical and semi-polygonal bodies and power transistors with strip leads in a triangular array (viewed parallel to the leads). All of these devices are characterized by a set of "radial" leads that extend from the body of the device in generally the same direction. For devices with fine wire leads it is especially important that the leads are not bent or placed in contact with one another by the processing, testing and sorting operations.

Figure 12:
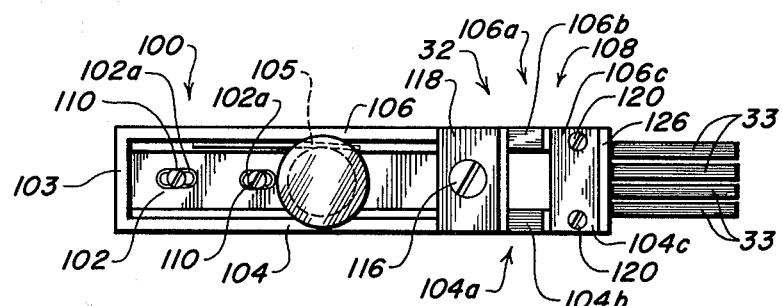
FIG. 12 is a to plan view of a contactor assembly according to this invention.
Figure 13:
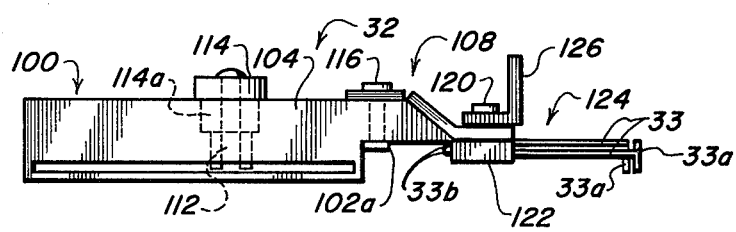
FIG. 13 is a view in side elevation of the assembly shown in FIG. 12.

The apparatus 12 includes a frame or housing 13 (FIGS. 3, 4, 14 and 15) which supports a conventional vibratory feed bowl 16, a linear feed track 18, a set of three test stations 20, and a set of bins 22 which collect devices which have been tested and/or otherwise processed at the test stations 20. A linear shuttle 24 carries the devices step-wise in cycled horizontal movement from a pick-off point 26 to a binning chute 28 with intermediate stops at the test stations 20. The linear shuttle 24 includes four sets of clamps or fingers 30 which are spaced apart by the same distance which separates the test stations 20. In each cycle of motion the clamp 30 grips the body of a radial lead device 14, raises it slightly, and carries it one "step" to the right, as shown. One or more of the test stations 20 can have an associated contactor assembly 32 that establishes an electrical connection between the leads of the device and testing circuitry through a set of contacts 33 (FIGS. 12 and 13). The contactor assemblies 32 are mounted on a platform 34 which in turn forms a part of an integral probe assembly 36 shown in detail in FIGS. 3, 4 and 9–11.

By way of an initial overview, in continuous operations a large number of devices 14 are placed in the bottom of the vibratory feed bowl 16 which is of conventional design. The vibration moves the devices to the upper rim of the bowl where air jets and associated guide plates (not shown) place them in a desired, "lead downward" orientation. Once oriented, the devices travel around the outer edge of the bowl and onto the linear feed track 18 which is open and supports the devices on an inclined plate 18a. The upper edge of the plate engages the lower face of the body of the devices and the leads rest against the face of the plate 18a. A vibratory drive advances the devices along the track 18 to the pick off point 26 defined by a pivoted stop piece (not shown) which abuts a device 14 when it is properly positioned at the pick-off-point 26. A conventional sensing device such as a photoelectric detector (not shown) indicates the presence of a device 14 at the pick-off point 26. The "device present" signal can initiate the operation of the linear shuttle 24 which carries each device 14, by incremental step-wise movements, through the test stations 20 to the binning chute 28 where it is released for gravity feed to one of the bins 22. Rotation of a lower portion 28a of the binning determines which bin collects the device 14. Generally the devices are sorted in the bins 22 according to whether or not they are defective and the quality of their responses to the tests performed at one or more of these stations 20.

A significant advantage of the present invention is that it can handle, test and sort radial lead devices having a wide variety of body sizes, masses, and configurations as well as a wide variety of lead types and configurations. Another significant advantage is that the apparatus 12 can operate in a continuous mode with a typical device throughput rate for small signal transistors of 7200 devices per hour. This processing rate is significantly higher than that attainable with conventional prior art apparatus. It should be noted that while the stations 20 can all be equipped with contactor assemblies adapted to test the devices 14, one or all of the stations can also be equipped with other equipment such as lead combs and/or dot markers. The particular equipment used at the stations 20 will, of course, depend on the nature of the device being processed and production requirements.

A principal feature of the present invention is the probe assembly 36 which includes a base member 38, a pair of rotary cams 40 and 42, the platform 34, and a bar linkage 44 which pivotally supports the platform 34. The linkage 44 is operatively coupled to the cams 40 and 42 through roller cam followers 46 and 48, respectively. The linkage 44 includes a lower support arm 50, a follower arm 52, and an upper platform support arm 54. The arms 50, 52 and 54 are shown in detail in FIGS. 9–11, respectively. The arms 50 and 52 have a common lower pivot axis defined by a shaft 56 journalled in an upstanding bearing block 38a of the base member 38. The upper end of the arm 50 is pivotally secured to the platform 32 through a shaft 58. The upper end of the arm 52 is pivotally secured to the lower end of the arm 54 by a common shaft 60. The upper end of the arm 54 is secured to the platform 34 by a shaft 62. The arms 50 and 52 each have formed integrally therewith, and extending generally at right angles, auxiliary arms 50a and 52a, respectively, which carry the cam followers 46 and 48, respectively, at their ends.

Compression springs 64, 64 are engaged between a support block 66 secured to the base 38 by screws 68 and spring receptacles 50b and 52b formed integrally with the arms 50 and 52, respectively. The springs 64, 64 urge the arms 50 and 52 to move clockwise (as shown) about the shaft 56. This biases the cam followers 46 and 48 against the associated cams 40 and 42, respectively.

With further reference to FIG. 3, the cams 40 and 42 are mounted on a common hub 82 which is seated on and rotates about a laterally projecting and generally cylindrical portion 38c of the base member 38. The hub contains an open slot or recess 84 which engages the end of the crank arm 86 secured to the end of a drive shaft 87 associated with the probe assembly. This arrangement provides a "single point" drive. Rotation of the drive shaft causes a corresponding rotation of the hub 82 and the cams 40 and 42. One cycle of operation corresponds to one complete rotation of the drive shaft and therefore the hub 82. The probe drive is cycled to stop in substantially the same angular position at the beginning and end of each cycle of operation. Preferably this angular stopping position is chosen so that the open slot 84 extends generally toward the rear of the assembly, away from the platform 34, as shown.

Another significant feature of the present invention is that the entire probe assembly including the base 38, the cams 40 and 42, the linkage 44 and the platform 34 form a single, integral probe assembly 36 which can be replaced as a unit. The probe assembly 36 is secured to the frame 13 of the apparatus 12 by a single screw 88 (FIG. 4) which engages an inclined threaded hole 38d in the front portion of the base member 38 and an aligned threaded hole 90 formed in the adjacent portion of frame 13. When the screw 88 is secured in the holes 38d and 90, the probe assembly is properly positioned with respect to the other components of the apparatus 12 and secured in that position. In particular, the drive shaft 87 is operatively connected to the hub 88 and the platform 34 carries contactor assemblies 32 or other equipment which is positioned to act on the leads of devices 14 held at the test stations 20. However, if it is desired to replace the probe assembly, as for example to process a significantly different type of device 14, it is necessary only to remove the screw 88 and pull the assembly 36 forward, in the general direction of arrow 92 in FIG. 3. It should be noted that the drive shaft readily detaches from an operative engagement to the hub 82 since the crank shaft 86 simply slides out of the mating recess 84. This rapid and convenient replacement of the probe assembly 36 allows the apparatus 12 to accommodate radial lead devices that vary widely in the size, configuration and mass of both their bodies and their leads.

The cams 40 and 42, in operative combination with the linkage 44, develop a characteristic closed loop motion of the platform 34 and the contactor assemblies secured on the platform 34. The motion occurs in a vertical plane that is generally perpendicular to the upper surface of the platform 34 and aligned with the leads. FIG. 5 illustrates one form of a closed loop motion particularly adapted for use in testing aligned strip leads of molded power devices. FIG. 6 shows a corresponding closed loop cycle of motion for certain small signal transistors. Regardless of the exact form of the path of motion, it has two components: a longitudinal component, indicated by the arrow 98, that is generally parallel to the leads; and a vertical component, indicated by the arrow 99; this is generally perpendicular to the leads. The longitudinal motion is an "in-and-out" reciprocating motion with respect to the body of the device with the "out" motion being away from the body. The vertical motion is an "up and down" motion with respect to the leads. In any cycled path of motion developed by a probe assembly 36 according to this invention, there is a portion of the motion where the vertical component is constant in an extreme lowered position and the longitudinal component is changing, usually in the "out" direction. This combination of motions results in a "wiping" or scraping action of the leads which, to a large extent removes any metal oxide coating which may have accumulated on the leads and thereby promotes a reliable electrical connection between the contacts 33 and the leads during an electrical testing of the device 14.

The precise shape of the closed loop path is a function of the drive train of the probe assembly and in particular on the configuration of the cams 40 and 42 and on the dimensions, pivot points and angular relations of the arms of the linkage 44. A given probe assembly 36 will therefore have its cams and linkages structured to develop a predetermined cycled motion that is suitable for the type of device 14 being processed and tested. For example, the path shown in FIG. 5, as mentioned above, is suitable for wiping and establishing a good electrical connection to aligned strip leads of molded power transistors.

Figure 7:
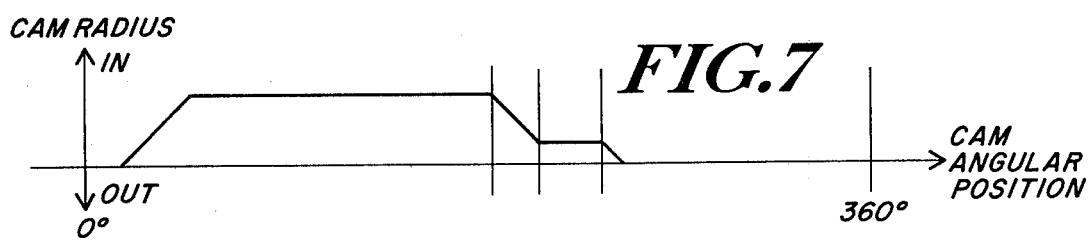
FIG. 7 is a timing diagram for the longitudinal cam of the probe assembly shown in FIGS. 3 and 4.
Figure 8:
FIG. 8 is a timing diagram corresponding to FIG. 5 for the vertical cam.
Figure 9:
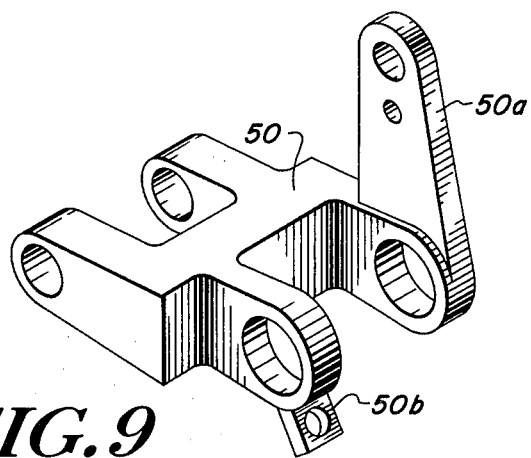
FIGS. 9–11 are views in perspective of the arms forming a portion of the drive train of the probe assembly shown in FIGS. 3 and 4.
Figure 10:
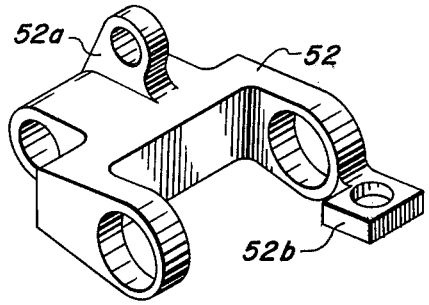
Figure 11:
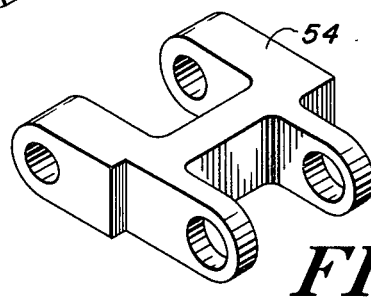

FIGS. 7 and 8 describe the controlling outer contour of the cams 40 and 42, respectively, used to generate this type of path. With respect to FIG. 7, the raised portions of the cam radius result in an "in" motion of the platform and contactor assemblies toward the body of a device 14. The horizontal axis corresponds to the extreme "out" position. With respect to FIG. 8, the raised portions of the cam radius result in an "up" motion of the platform and the contactor assemblies. The horizontal axis corresponds to the extreme lowered position of these elements.

If the strip leads of the power transistor are in a triangular array, the characteristic cycled motion will require a much longer vertical component of motion to place all of the contacts 33 in electrical connection with leads that are at different vertical heights (measured along the direction 99). By way of further example, when this invention is used to process signal transistors with long wire leads, the "out" component of the longitudinal motion is preferably comparatively long to provide a combing action that straightens the leads prior to initiating the electrical test. This combing straightens the leads and ensures that they do not contact one another during the test.

FIGS. 4, 12 and 13 show a contactor assembly 32 according to this invention which is specifically designed for use in testing a molded power transistor 14b having three aligned strip leads. The assembly has a generally box-like configuration formed from a stamped structural sheet material which is resilient. The assembly has a main frame 100 which includes a generally planar bottom wall 102, a rear wall 103 at right angles to the bottom wall 102, and a pair of side walls 104 and 106 which extend generally parallel to one another from the rear wall to a forward end 108 of the assembly. The walls 102, 103, 104, and 106 are joined only at the rear wall 103. The bottom wall 102 includes an aligned set of elongated and longitudinally extending closed slots 102a, 102a which each receive a set screw 110 that secures the frame 100 to the upper surface of the platform 34. When the screws 110 are loosened slightly, the entire assembly 34 may be adjusted longitudinally by sliding the assembly over the platform along the closed slots 102a, 102a and then tightening the screws 110. The bottom wall also has secured to it a generally upstanding stud 112 which mounts a manually rotatable cam 114 engaged between the wall 104 and a leaf spring 105 secured to the wall 106. Because the bottom wall 102 is not attached to the sidewalls 104, 106 along their lengths, rotation of the cam 114, which includes an eccentric portion 114a, causes the sidewalls 104 and 106 to bend laterally, in unison, to either the left or right depending on the direction of rotation of the cam 114. This provides a lateral adjustment of the contacts 33 with respect to the leads. A spring-loaded screw 116 provides a vertical adjustment of the contacts with respect to the leads. The screw 116 extends between an upper bracket 118 which is secured to and spans the side walls 104, 106 and a forward portion 102a of the bottom wall 102 which is generally horizontal and located above the main portion of the bottom wall. The vertical location of the wall portion 102a is substantially fixed so that a tightening of the screw 116 causes a downward movement of the forward end of the side walls 102, 106 (through a flexure of the rear wall about its point of connection with the bottom wall 102). The bracket 118 also serves to maintain the spacing of the side walls during rotation of the cam 116 to establish a lateral positional adjustment.

The forward portion 108 of the contact assembly 110 includes a pair of symmetrical, spaced-apart, and forwardly extending portions 104a and 106a of the side walls 104 and 106, respectively. Each portion 104a and 106a includes a downwardly inclined section 104b, 106b that extends generally from the bracket 118 to an associated, generally horizontal section 104c, 106c. Mounting screws 120, 120 that each engage a hole in the section 104c, 106c secures a body 122 of a contact assembly 124 to the frame 100. In the illustrated embodiment, the contacts 33 comprise four sets of Kelvin contacts each with a generally downwardly projecting portion 33a that makes electrical connection with and scrapes the leads 17 and a rear portion 33b which is each secured to a wire (not shown) connected to conventional test circuitry. The wires are preferably mounted by threading them through holes in an upstanding mounting bracket 126 also secured to the sections 104c and 106c by the screws 120, 120.

With this form of contact assembly 124, the vertical adjustment provided by the screw 116 can be used to adjust not only the vertical position of the contacts 33 but also the contact force between the contacts and the leads. With other forms of contacts, such as ones designed to engage a triangular array of fine wire leads, the vertical adjustment is only positional. It should also be noted that a significant advantage of the present invention is that a highly effective scraping of the leads by the contacts is achieved not through a flexure of the contacts themselves, as is frequently the case in the prior art, but rather through the aforementioned wiping motion of the entire contact assembly as driven by the probe assembly 36. It is also significant to note that the entire contactor assembly 32, which usually includes the contact assembly 124, can be quickly and conveniently removed or replaced from the platform 34 by removing the two screws 110, 110.

The linear transfer shuttle 24 provides a cycled, generally horizontal, reciprocating motion that successively carries a device positioned at the pick-off point 26 through the following test stations 20 to a point over the chute 28 where it is released for a gravity feed to one of the bins 22. The major component of the motion of the shuttle is a horizontal reciprocation corresponding to a full cycle of operation of the linear shuttle 24. The shuttle also provides a gripping and releasing motion of its clamps 30 and a slight lifting motion of the devices from the rest positions at the pick-off point and test stations to avoid damage to the leads during the horizontal carrying motion. The gripping, releasing and lifting motions are coordinated with the reciprocating horizontal motion. At the beginning of each cycle of operation, the shuttle 24 is in its extreme left position, as shown in the solid lines in FIG. 1, with the fingers 30 gripping a device 14. The shuttle then lifts all of the clamps and any devices held in the clamps slightly from the test stations or the guide track 18 and carries them to the right to the following test station 20 or the chute 28. The shuttle then lowers the devices into a testing position at one of the stations 20 where the clamps 30 release the devices. The entire shuttle assembly returns horizontally to its initial position where the clamps 30 close to grip the "following" set of devices 14. The shuttle 24 thus executes a "pick and place" motion during each cycle of operation.

With reference to FIGS. 14-17, the linear shuttle assembly 24 includes a main shuttle sub-assembly 130 (best seen in FIGS. 14 and 15) that is organized around a tubular support member 132 which is slidably engaged on a shaft 134 secured in a pair of side walls 13a, 13a of the housing 13. A lower mounting plate 136 is secured to the tubular member 132 by a pair of support arms 138, 138 which extend generally radially from the member 132. An upper mounting plate 140 is held in a generally parallel, spaced apart relationship with respect to the lower mounting plate by a pair of support arms 142, 142 secured at one end to a support shaft 144. A pair of mounting brackets 146 and 148, each secured at an end of the tubular support member 132 and extending generally upwardly, mount the shaft 144. The upper support shaft 144 is restrained against axial movement with respect to the tubular member 132, but is rotatable about the horizontal axis defined by the brackets 146 and 148. Similarly, the lower tubular support 132 is rotatable about the shaft 134. The sub-assembly 130 is therefore capable of moving horizontally along the shaft 134 and capable of pivoting the members 132 and 144 independently to develop a corresponding rotational movement of the upper and lower plates 136 and 140, respectively.

Figures 14, 15:
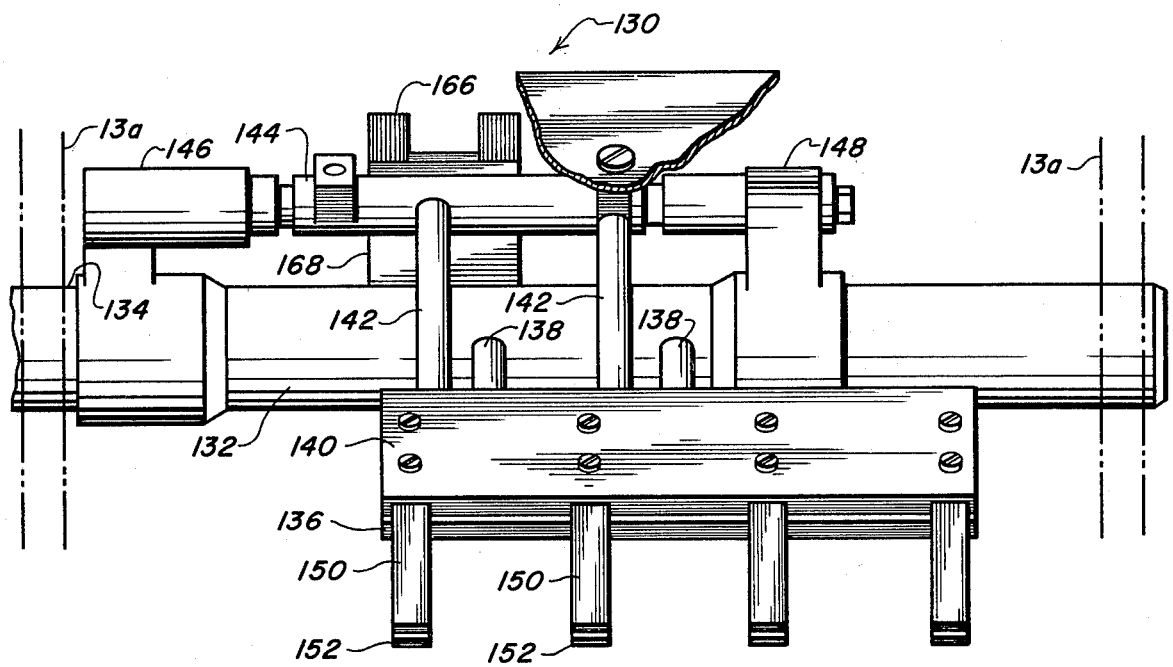
FIG. 14 is a view in front elevation with portions broken away of the main shuttle sub-assembly of the linear transfer shuttle including four sets of clamps adapted to grip the devices.
FIG. 15 is a view is side elevation and partially in section of the sub-assembly shown in FIG. 14 and including drive sub-assemblies to develop a reciprocating translation of the main shuttle and to operate the clamps.

The upper and lower mounting plates each support a set of upper and lower clamp members 150 and 152, respectively, that reliably grip a particular type of device 14 when the upper and lower mounting plates are in a closed position (FIG. 14 and solid line position in FIG. 15). When the upper and lower mounting plates are in an open position, that is, when they are pivoted away from one another as indicated in phantom in FIG. 15, the clamps release the devices. The aforementioned lifting and lowering movement of a gripped set of devices is developed by a coordinated pivoting of the upper and lower plates when they are both in the closed position.

Figure 16:
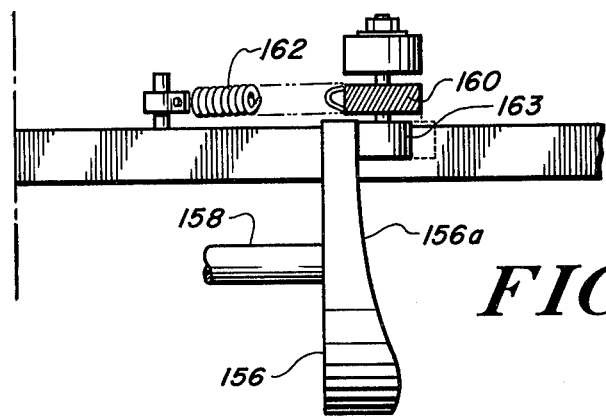
FIG. 16 is a view taken along the line 16—16 in FIG. 15.
Figure 17:
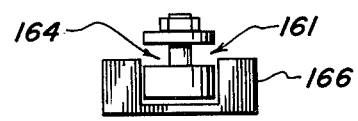
FIG. 17 is a view taken along the line 17—17 in FIG. 15.

FIGS. 15-17 show a drive sub-assembly 154 which develops the reciprocating horizontal movement of the sub-assembly 130. The sub-assembly 154 includes a rotating cam member 156 secured on the end of a drive shaft 158 that operatively engages a drive arm 160. The drive arm is pivoted for lateral movement at its lower end 160a. Its upper end 160b carries a rotatable drive pin 161. A spring 162 biases the drive arm 160 into operative engagement with the cam 156 through a roller bearing cam follower 163 secured on the lower side of the arm 160 at a point intermediate the ends 160a and 160b. The cam 156 has a generally circular configuration with a laterally projecting flange 156a whose end surface engages the roller bearing. One complete revolution of the shaft 158 and therefore the cam 156 drives the arm 160 through a complete cycled lateral motion about is lower pivot point. The pin 161 engages a slot 164 formed in a block 166 secured to the tubular member 132 through a mounting plate 168. The pivoting motion of the drive arm 160 therefore results in purely horizontal reciprocating motion of the shuttle subassembly 130.

FIG. 15 illustrates a sub-assembly 170 which develops the opening and closing movements of the upper and lower mounting plates as well as the coordinated raising and lowering of the mounting plates in the closed position. The assembly 170 includes a drive shaft 172 and a pair of rotary cams 174 and 176 both secured on the shaft 172 for rotary motion therewith. As with other components of the probe assembly and linear shuttle mechanism described above, one complete rotation of the drive shaft 172 and the associated cams is associated with one cycle of motion of the linear shuttle. Also, the actions controlled by the outer edges of the cams 174 and 176 are coordinated with the rotation drive shafts 172 and 158 so that the lifting and the opening and closing motions controlled by the cams 174 and 176 are in coordination with the horizontal reciprocating motion under the control of the cam 156. The rotation of the drive shafts 172, 158, and the drive shaft of the probe assembly 36 are preferably driven by a common electric motor (not shown) that operates at a constant speed with the various drive shafts powered through a geared drive train (not shown) or timing box that establishes a positive, reliable correlation between the rotation of each of the aforementioned drive shafts.

The sub-assembly 170 also includes a pair of runner plates 178 and 180 that are each pivotally mounted on a shaft 182 that is generally parallel to the shafts 172 and 158 as well as the tubular support 132 and the upper support shaft 144. The shaft 182 is secured betweeen the walls 13a, 13a of the housing. The upper surface of each runner plate preferably includes a layer 178a, 180a of a highly wear resistant material. The runner plate 178 is supported on an arm 184 that pivots about the shaft 182 and carries at its end opposite the shaft a roller 186 which follows the outer contour of the cam 176. The cam 176 therefore controls the movement of the entire runner plate 178 about the shaft 182. Similarly, the runner plate 180 is supported on an arm 188 that pivots about the shaft 182 and carries a roller 190 which follows the outer contour of the cam 174. Thus, the cam 174 controls the movement of the runner plate 180.

The upward and downward movements of the runner plates are converted into corresponding movements of the upper and lower mounting plates 140 and 136 by a pair of "outrigger" arms 192 and 194. The arm 192 is secured at one end to one of the upper mounting plate support arms 142. At its opposite end it carries a roller 196 which rides along the runner plate 178 as the shuttle sub-assembly 130 reciprocates horizontally. The arm 194 is secured at one end to the tubular support member 132. It also has a roller bearing 198 mounted at its end removed from the member 132 and adapted to ride along the runner plate 180 as the assembly 130 reciprocates horizontally. A spring 200 engaged between the arm 194 and an arm 202 that is secured to the upper support shaft 144 biases both of the roller bearings 196 and 198 into a continuous engagement with the associated runner plates.

In operation, rotation of the cam 174 to a point of increased radius, i.e. a lift area, drives the runner plate 180 in a generally upward motion that is indicated by the arrow 204 in FIG. 15. This upward motion in turn rotates the arm 194 against the action of the spring 200 causing a rotation of the tubular support member 132 and a corresponding downward rotation of the lower mounting plate 136 in the direction of the arrow 206. In a similar manner, a lifting portion of the cam 176 raises the runner plate 178 which drives the arm 192 in a clockwise rotation about the support shaft 144 in the direction of the arrow 208 which causes the upper clamp plate 140 to raise. The combined lowering of the lower clamp plate in the direction 206 and the raising of the upper clamp plate in the direction of the arrow 208 moves the clamp elements 150 and 152 mounted on these plates to a position of maximum separation that defines the "open" or "release" position of the clamps 30. In this position the clamps are clear of any device situated at the pick-off point 26 or any of the test stations 20. Conversely, when the cams 174 and 176 are at their lowered positions, the runner plates 178 and 180 move to a corresponding lowered position which causes the upper and lower mounting plates to move toward one another to their "closed" or "gripping" position. To lift a device 14 when it has been gripped, the cams 174 and 176 are structured to move the mounting plates 136, 140 slightly upwardly in direction of the arrow 208 in the manner described above.

There has been described an automatic handling, testing and sorting apparatus for radial lead electronic devices which is highly versatile in that it can process a wide variety of such devices. The apparatus is also characterized by a fast operating speed and a high degree of reliability both in terms of the quality of the electrical tests performed on the devices and the durability of the apparatus itself. The apparatus also is capable of effectively combing leads of small signal transistors and the like and making an unusually reliable electrical connection between the test contacts and the leads through a strong wiping action of the contacts along the leads. The present invention has the further advantage that key components are readily disassembled from the apparatus and replaced to accommodate the changes in the devices being handled. In particular, the entire probe assembly including the drive train which develops a characteristic motion of the contacts for the particular device being processed as well as the entire contactor assembly, the clamps adapted to grip the devices and subassemblies of the linear transfer shuttle are all readily replaced with a minimum of interruption in production operations.

While the invention has been described with respect to its preferred embodiments, it will be understood that various modifications and variations will occur to those skilled in the art. For example, while the drive train for the probe assembly has been described as a cam and four-arm linkage arrangement, it will be understood that other alternative mechanical arrangements can be used to perform the same function. Similarly, alternative mechanical arrangements can be devised to generate the gripping and carrying functions of the linear transfer shuttle. Also, while the invention has been described with respect to a three station apparatus, it will be understood that the principles of the invention are applicable to an apparatus having only one station or more than three stations. These and other variations are intended to fall within the scope of the appended claims.

What is claimed and desired to be secured by Letters Patent is:

1. In an apparatus for automatically handling and testing radial lead electronic devices, said apparatus including a housing, a drive shaft mounted on said housing for rotational motion, and at least one contactor assembly including a set of contacts adapted to establish electrical connection with the leads of said devices when they are held stationary at a test station with their leads extending generally in a first direction, the improvement comprising, a probe assembly supported on said housing that includes a platform that mounts said contactor assembly, means powered by said rotating drive shaft for driving said platform in a closed loop cycle of motion, said cycle of motion including components of motion in said first direction and in a second direction perpendicular to said first direction, a portion of said cycle of motion placing said contacts in an engaging relationship with said leads and drawing said contacts along said leads in a wiping movement, and means for replaceably connecting said drive shaft to said drive means, said probe assembly comprising an integral, self-contained unit.

2. Apparatus for automatically handling and testing radial lead electronic devices that are held stationary at at least one test station with their leads extending generally in a first direction, comprising, a housing, rotating drive means mounted on said housing, a shuttle mounted on said housing and powered by said drive means, said shuttle operating in successive cycles of operation to transfer the devices from a pick off point to said test station along a generally linear path, a contactor assembly associated with said test station that includes a set of contacts adapted to make electrical connection with said leads when the device is positioned at said test station by said linear shuttle, and a probe assembly comprising (i) a platform that supports said contactor assembly, (ii) means for driving said platform in a closed loop cycled motion in coordination with said cycle of operation of said linear shuttle, said cycled motion including components of motion in said first direction and in a second direction perpendicular to said first direction, said cycled motion also including a loop portion where said contacts engage said leads in a wiping movement associated with said electrical connection, and (iii) means for replaceably connecting said rotating drive means to said probe assembly driving means, said probe assembly and said contactor assembly mounted on said probe assembly comprising an integral, self-contained unit.

3. Apparatus according to claim 2 wherein said driving means comprises pivoted support means for said platform and cam means operatively coupled between said rotating drive means and said support means.

4. Apparatus according to claim 3 wherein said cam means and said pivoted support means are structured to develop said cycled motion of said contactor assembly from said rotation of said drive means.

5. Apparatus according to claim 4 wherein said pivoted support means comprises first, second and third linkage arms each pivotally connected at both ends of each of said arms.

6. Apparatus according to claim 5 wherein said cam means comprises two rotary cams.

7. Apparatus according to claim 6 wherein said first and second arms have a common pivot axis spaced from said platform and said first and second arms each follow one of said cams.

8. Apparatus according to claim 7 further comprising means for biasing said first and second linkages to follow said cams.

9. Apparatus according to claim 7 wherein said first linkage is pivotally connected at one end opposite said pivot axis to said platform and wherein said third linkage is pivotally connected between said platform and the end of said second linkage opposite said pivot axis.

10. Apparatus according to claim 6 wherein said cams are driven in unison by said drive means.

11. Apparatus according to claim 10 wherein said means for replaceably connecting comprises a detachable single point drive.

12. Apparatus according to claim 11 wherein said detachable single point drive includes a crank arm secured to said drive shaft and an open slot operatively connected to said cams which engages said crank arm.

13. Apparatus according to claim 12 wherein said cams are secured on a common hub and said open slot is formed in said hub.

14. Apparatus according to claim 11 wherein said cycled motion initiates and terminates with said single point drive in substantially the same angular position.

15. Apparatus according to claim 14 wherein said angular position is chosen to allow said replacement of said probe assembly from said housing.

16. Apparatus according to claim 2 further comprising means for replaceably securing said probe assembly to said housing.

17. Apparatus according to claim 15 wherein said replaceable securing means comprises screw means.

18. Apparatus according to claim 2 wherein said cycled motion has a component of reciprocal motion along said leads and a coordinated component of reciprocal motion perpendicular to said leads.

19. Apparatus according to claim 18 wherein said component of motion along said leads is directed away from the body of said device when said perpendicular component of motion is in a lowered position that places said contacts into electrical connection with said leads.

20. Apparatus according to claim 2 wherein said contactor assembly includes frame means secured to said platform.

21. Apparatus according to claim 20 wherein said frame means is movable laterally to adjust the lateral location of said contacts on said leads.

22. Apparatus according to claim 21 wherein said frame means includes a pair of side walls and further comprising cam means acting on said side walls to perform said lateral adjustment.

23. Apparatus according to claim 20 wherein said frame means is adjustable in a direction generally perpendicular to said leads.

24. Apparatus according to claim 23 further comprising a spring loaded screw coupled between a vertically movable portion of said frame means and a substantially fixed portion of said frame means.

25. Apparatus according to claim 20 further comprising means for adjusting the longitudinal position of said contacts with respect to said leads.

26. Apparatus according to claim 25 wherein said frame means includes a bottom wall adjacent said platform and wherein said longitudinal adjustment means comprises slots formed in said bottom wall and screw means engaged in said slots that secured said bottom wall to said platform, said slot means extending generally in the direction of said leads.

27. Apparatus according to claim 2 wherein said shuttle includes a set of clamping members each adapted to grip one of said devices when said clamping members are in a closed position.

28. Apparatus according to claim 27 wherein said shuttle includes means for driving said shuttle in a linear reciprocating motion along said linear path.

29. Apparatus according to claim 28 wherein driving means includes a rotary cam powered by said rotating drive means and a pivoted drive arm operatively engaged to said rotary cam and to said shuttle.

30. Apparatus according to claim 28 wherein said shuttle further comprises means for opening and closing said clamping members in coordination with said reciprocating motion.

31. Apparatus according to claim 30 wherein said opening and closing means comprises cam means powered by said rotating drive means and mechanical means for translating the motion of said cam means into said opening and closing motion of said clamping members.

32. Apparatus according to claim 31 wherein said mechanical means comprises a pair of runner plates operatively engaged to said cam means and cam follower means for converting the movement of said runner plates into corresponding movements of said clamping members.

33. Apparatus according to claim 28 wherein said shuttle includes first and second support members adapted for said reciprocating movement, and each being rotatable about said the direction of said linear path and supporting first and second opposed mounting plates that carry said clamping members.

34. Apparatus according to claim 30 wherein said opening and closing means further includes means for raising said devices from said pick-off point and said test stations after they have been gripped by said clamping members.

* * * * *